United States Patent
Chapman

[11] Patent Number: 5,933,740
[45] Date of Patent: Aug. 3, 1999

[54] RTP BOOSTER TO SEMICONDUCTOR DEVICE ANNEAL

[75] Inventor: Richard A. Chapman, Dallas, Tex.

[73] Assignee: Texas Instruments Incorporated, Dallas, Tex.

[21] Appl. No.: 08/644,634

[22] Filed: Apr. 30, 1996

[51] Int. Cl.[6] .................................................. H01L 21/336
[52] U.S. Cl. ........................ 438/303; 438/301; 438/305; 438/306; 438/307
[58] Field of Search ..................................... 438/303, 305, 438/306, 307, 301, FOR 174, FOR 185, FOR 188

[56] References Cited

U.S. PATENT DOCUMENTS

| 5,169,796 | 12/1992 | Murray et al. | 438/307 |
| 5,382,533 | 1/1995 | Ahmad et al. | 438/301 |
| 5,468,666 | 11/1995 | Chapman | 438/226 |
| 5,472,896 | 12/1995 | Chen et al. | 438/305 |
| 5,489,540 | 2/1996 | Liu et al. | 438/228 |

FOREIGN PATENT DOCUMENTS 0 575 099  12/1993  European Pat. Off. .
363181418  7/1988  Japan .

OTHER PUBLICATIONS

International Electron Devices Meeting, Dec. 6–9, 1987, Washington, D.C., pp. 367–370, "0.25 Micron CMOS Technology Using P+ Polysilicon Gate PMOSFET" (N. Kasai, et al.).

Primary Examiner—Peter Toby Brown
Assistant Examiner—Khanh Duong
Attorney, Agent, or Firm—Jacqueline J. Garner; W. James Brady, III; Richard L. Donaldson

[57] ABSTRACT

A method is provided for increasing the electrical activation of dopants in a semiconductor device using rapid thermal processing (RTP). An aspect of the invention includes forming a gate on a semiconductor body (12), such as a substrate (14), and implanting a dopant (28) into the semiconductor body (12) proximate the gate. The dopant (28) is partially activated using a furnace. The dopant (28) is further activated using RTP. The activation of the dopant (28) through RTP in addition to the furnace annealing allows almost complete activation of the dopant while maintaining acceptable channel depths.

14 Claims, 4 Drawing Sheets

RTP BOOSTER TO SEMICONDUCTOR DEVICE ANNEAL

TECHNICAL FIELD OF THE INVENTION

The present invention relates to semiconductor processing and more specifically to a rapid thermal processing booster to the anneal of implants for semiconducter devices.

BACKGROUND OF THE INVENTION

Integrated circuits (IC) are single chips made of a semiconductor material with at least one interconnected array of active and passive elements capable of performing at least one complete electronic circuit function. In recent times the number of semiconductor devices formed on a chip such as transistors, diodes, and resistors has increased. With the increase of density of the integrated circuits it becomes necessary to shrink the dimensions of N-channel metal-oxide-semiconductor field-effect transistors (NMOS) and P-channel metal oxide semiconductor field effect transistors (PMOS).

The electrical operation of devices on semiconductor chips depends on regions of different doping types and concentrations. The electrical character of these regions is altered by introducing dopants into the substrate, accomplished by ion implantation and/or diffusion. Diffusion is the process by which a species moves as the result of the presence of a chemical gradient. The diffusion of controlled impurities or dopants into silicon is the basis of the P-N junction formation and device fabrication in very-large-scale integrated circuits (VLSI) processing.

In the earlier days of transistor and IC processing, dopants were supplied to the silicon by chemical sources. These dopants were then diffused to the desired depths by subjecting them to elevated temperatures (e.g., 900 to 1200 degrees Celsius). More recently, ion implantation has become a major means for the introduction of dopant atoms into silicon. Relatively shallow dopant profiles can be obtained by using low energy ion implantation. In addition, however, ion implanted devices are frequently subjected to elevated temperatures in order for the implanted impurities to become electrically active and so that defects from the implantation are removed by annealing. While the elevated temperatures electrically activate the dopant, the elevated temperatures may also cause diffusion of the dopants deeper into the silicon.

As the density of integrated circuits increases, it becomes necessary to shrink the dimensions of semiconductor devices such as NMOS and PMOS transistors. New problems and difficulties surface as the dimensions are reduced. One difficulty that has developed is producing transistors with the desired characteristics but with junction depths that accommodate the smaller dimensions. The junction depth affects all transistor dimensions because proper scaling between the junction depth and other important dimensions is typically required. For example, if junction depths are too great, the lateral extent of the junctions may short the device. Although shallower junctions may be desirable, it is also desirable to have certain performance characteristics met including reduced sheet resistivity and lower Miller capacitance.

Dopant species such as boron, which is frequently used for PMOSFET sources and drains, and phosphorus, which is often included in NMOSFET sources and drains, have high diffusion coefficients and rapidly diffuse into silicon. Furnace anneal temperatures in the 800 to 900° C. range can be used to obtain the correct diffusion depth for boron and phosphorus for many sub-micron MOSFET designs. But, temperatures of 1000° C. or higher are typically needed to fully activate these dopant species when they are present in the high concentrations desired for MOSFET sources and drains.

One approach to attempting to solve the difficulty of developing the desired performance without rendering the device inoperative is to increase the side spacer or sidewalls and then make a deeper junction. This approach, however, lessens the overlap so that there is less Miller capacitance, but the source potential barrier is lowered by the drain voltage, i.e., drain-induced barrier lowering (DIBL).

Another approach to attempting to address this difficulty would be to increase the total concentration of the dopant and activate the dopant with a lower annealing temperature; however, not all of the dopant would be activated. For example, if the annealing temperature being used will activate approximately half of the dopant, this approach would attempt to solve the problem of insufficiently activated dopant by doubling the total concentration. This approach is typically not satisfactory because the diffusion coefficient increases as total concentration increases. Thus, the decreased diffusion that would normally occur at lower annealing temperatures is offset by the increased diffusion caused by the higher diffusion coefficient that results from a greater total concentration.

Another approach attempting to solve the problem of obtaining good activation of the source and drain dopants would be to use RTP to both diffuse and activate these species. RTP is, however, very difficult to control and the maximum temperature will vary across a silicon wafer and can vary from wafer to wafer. This variation causes the depth and lateral extent of the source and drain to vary and decrease the yield of good integrated circuit chips.

SUMMARY OF THE INVENTION

Therefore, a need has arisen for a method that allows for activating dopants used to make semiconductor devices but without excess diffusion.

According to an aspect of the present invention, a method for forming a semiconductor device is provided that includes the steps of forming a gate on a semiconductor body, implanting a dopant into the semiconductor proximate the gate, diffusing and activating a portion of the dopant using a furnace, and further activating the dopant using rapid thermal processing (RTP). According to another aspect of the present invention, a semiconductor device is provided that is produced according to the steps of forming a semiconductor substrate, forming a gate on the semiconductor substrate, implanting a dopant into the substrate, diffusing and activating a portion of the dopant with a furnace, and further activating the dopant using RTP.

A technical advantage of the present invention is that the semiconductor devices produced by the invention have a higher frequency response because the devices typically have a smaller Miller capacitance between gate and drain. Another technical advantage of the present invention is that it may be used with otherwise existing processes designed for use with a furnace but for which additional performance is desired from the product. Yet another technical advantage of the present invention is that it allows the use of highly-diffusible dopants in a process that is less variable than other processes.

Another technical advantage is that the source and drain junction depths and lateral extents are determined by a well controlled furnace operation, but high performance resulting from low series resistance is also obtained by further activating the source and drain species by means of RTP.

BRIEF DESCRIPTION OF THE DRAWINGS

For a more complete understanding of the present invention, and the advantages thereof, reference is now made to the following written description taken in conjunction with the accompanying drawings, in which.

DETAILED DESCRIPTION OF THE INVENTION

Figure 1:
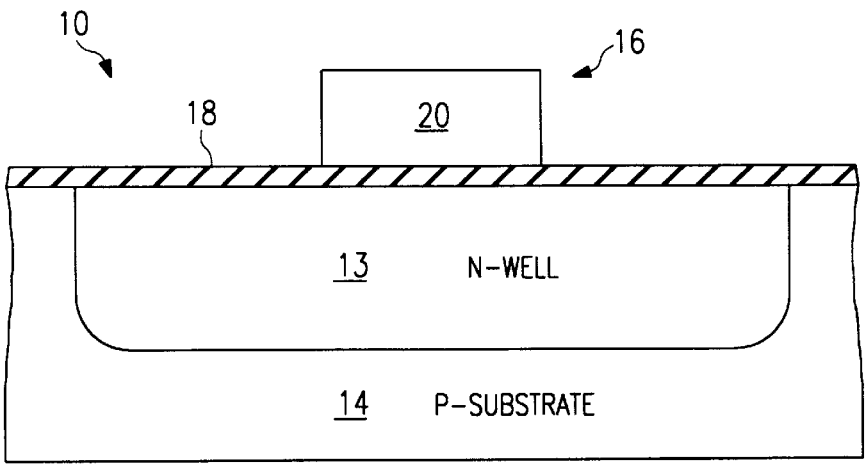
FIG. 1 is a cross-sectional view of a portion of a semiconductor chip suitable for use as a starting point for fabrication of a preferred embodiment of the invention.

The preferred embodiments of the present invention and its advantages are best understood by referring to FIGS. 1–11 of the drawings, like numerals being used for like and corresponding parts of the various drawings.

An aspect of the present invention involves providing a rapid thermal processing (RTP) booster to more fully activate a dopant on a semiconductor wafer. In the rapid thermal processing step, wafers are subjected to high temperatures only long enough to achieve the desired process effect.

Wafers in an RTP system are thermally isolated, so that radiant (not conductive) heating and cooling is dominant. Temperature uniformity is an important design consideration so that thermal gradients, which can cause slip or warpage, are minimized. Various heat sources may be utilized for the RTP process, including arc lamps, tungsten-halogen lamps, and resistively-heated slotted graphite sheets. A heating chamber provides a controlled environment for the wafer, and a convenient site for coupling energy from the radiant energy sources to the wafers. Most heating is done in inner atmospheres or vacuum, although oxygen or ammonia for growth of $SiO_2$ and $Si_3N_4$ may be introduced into the chamber in RTP systems.

By using an RTP booster according to an aspect of the present invention, satisfactory results are obtained without excessively deep junctions. For example, the present invention has been used on NMOS and PMOS junctions using RTP anneal with the following results:

| | | SIMS JUNCTION DEPTHS | | | | | |
|---|---|---|---|---|---|---|---|
| | | NMOS: | 2.0E15-As/cm2 @ 70keV | | | | |
| | | | 1.0E14-P/cm2 @ 40keV | | | | |
| | | PMOS: | 1.5E15-B/cm$^2$ @ 10keV | | | | |
| | | 875C ONLY | +975C/20s | +1000C/10s | +1000C/20s | +1025C/10s | +1025C/20s |
| 1 | NMOS As Xj | 0.16 um | 0.16 um | 0.16 um | 0.16 um | 0.16 um | 0.16 um |
| 2 | NMOS As&P Xj | 0.23 um | 0.23 um | 0.23 um | 0.23 um | 0.23 um | 0.23 um |
| 3 | PMOSB Xj | 0.24 um | 0.24 um | 0.24 um | 0.24 um | 0.248 um | 0.252 um |
| 4 | N Ohms/ Sq. um | 102 | 89 | 88 | 87 | 86 | 84 |
| 5 | P Ohms/ Sq. um | 213 | 155 | 143 | 126 | 116 | 106 |

The first three rows provide information on specific junctions and the last two rows reflect sheet resistance for NMOS and PMOS respectively. The first column of data is for a furnace alone at 875° Celsius and the remaining columns are with a furnace plus an RTP booster anneal at the temperature shown for the duration shown. This information is described in more detail below.

The first row of data on junction depths is for an NMOS junction formed using arsenic N-dopant only. The second row of data on junction depths is for an NMOS junction formed using a combination of arsenic and phosphorus dopants. In both of these NMOS cases, the RTP operation did not change the NMOS junction depth.

The third row of data on junction depths in this table suggests that the RTP operation increases the junction depth of a boron P-dopant PMOS junction for RTP temperatures of 1025° C. or higher. The last two rows, rows four and five, show that adding the RTP operation decreases the sheet resistance (in ohms per square) for both NMOS and PMOS. RTP temperature that does not increase the junction depth of either the NMOS or the PMOS but does lead to the lowest sheet resistance is desirable.

A preferred technique uses an RTP booster at approximately 1000° C. for approximately 15 seconds and results in a decrease of series-resistance-times-transfer-width from 2000 ohm-microns to 1000 ohm-microns. An embodiment of the invention is presently being used to fabricate CMOS integrated circuits with titanium disilicide on poly gates, sources, and drains. Aspects of the invention are, however, suitable for use in many situations.

Referring now to FIG. 1, there is shown a portion of a CMOS semiconductor chip 10. CMOS semiconductor chip 10 includes semiconductor body 12 with a P-type substrate 14 having n-wells 13 and p-wells (not explicitly shown) formed as part of the substrate. The present invention may be used both in the formation of PMOS in the n-wells and NMOS in the p-wells although the steps are described for the formation of a PMOS in a n-well. The present invention is also useful for CMOS having an N-type substrate and for PMOS and NMOS outside the CMOS setting.

Figure 2:
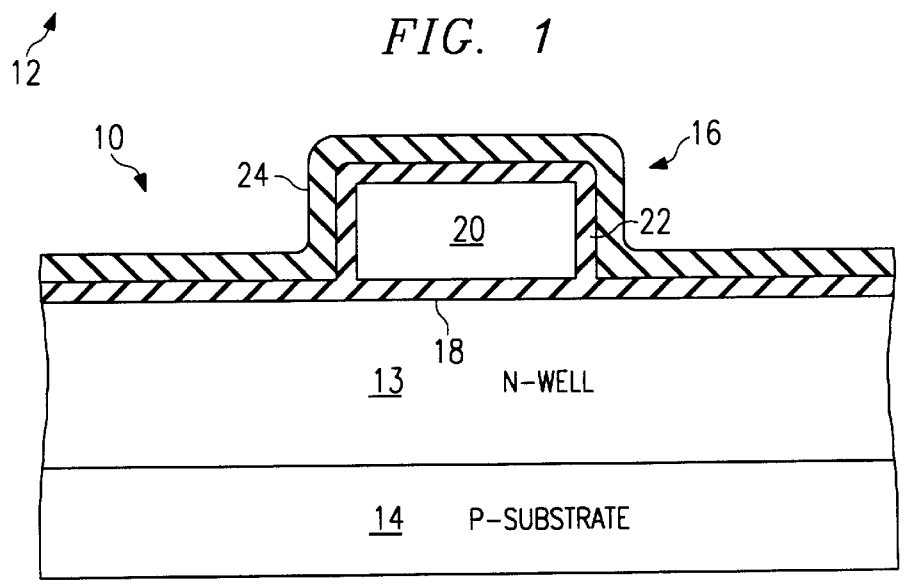
FIG. 2 is a cross-sectional view of a portion of a semiconductor chip reflecting some of the steps of the fabrication of a semiconductor device.
Figure 3:
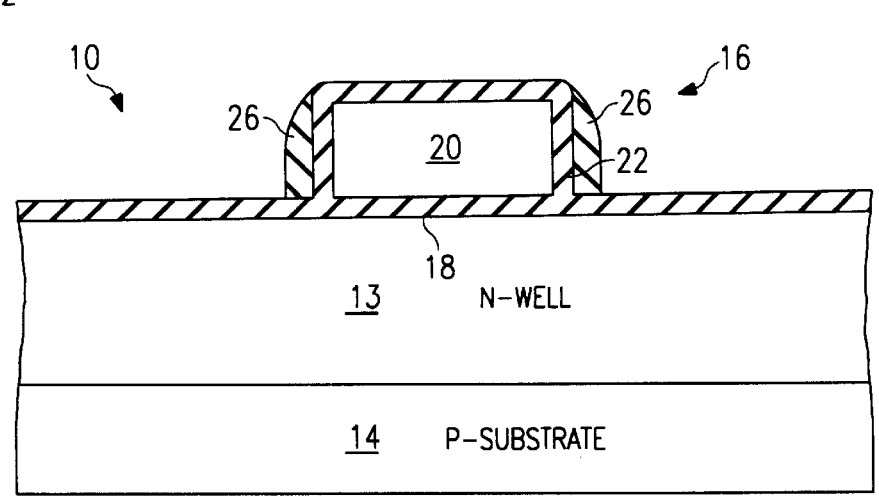
FIG. 3 is a cross-sectional view of a portion of a semiconductor chip reflecting some of the steps of the fabrication of a semiconductor device.

In FIG. 1, a polysilicon gate 16 has been formed by placing a layer of oxide or gate oxide 18 on n-well 13 and then placing a polysilicon layer 20 thereon. Referring to FIG. 2, an additional or second oxide layer 22 has been added over polysilicon layer 20. Additionally, a silicon nitride 24 has been placed over oxide layer 22. Sidewalls 26 are formed by an anisotropic sidewall etch of the nitride 24 as reflected in FIG. 3. Alternatively, another material such as silicon dioxide may be substituted for silicon nitride.

Figure 4:
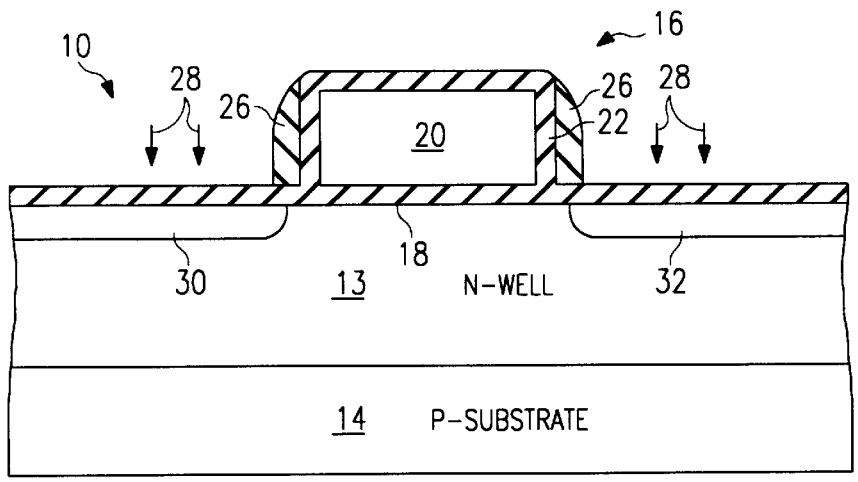
FIG. 4 is a cross-sectional view of a portion of a semiconductor chip reflecting some of the steps of the fabrication of a semiconductor device.
Figure 5:
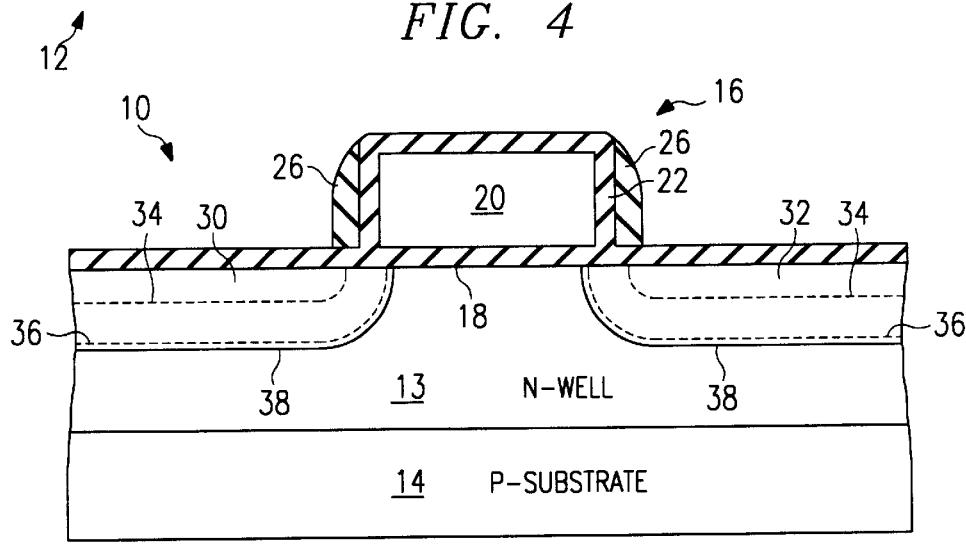
FIG. 5 is a cross-sectional view of a portion of a semiconductor chip reflecting some of the steps of the fabrication of a semiconductor device.

Referring now to FIG. 4, a highly diffusible dopant (for example boron for a PMOS transistor, or phosphorous for an NMOS transistor) is implanted into n-well 13 (p-well for NMOS) as indicated by arrows 28 in FIG. 4 to produce source 30 and drain 32. Further activation and diffusion of the dopant is required and may be accomplished by furnace annealing; for example using a furnace to anneal at 850° Celsius for five minutes (plus ramp up and ramp down) for a boron dopant on a PMOS. The furnace annealing while activating a portion of the dopant will not fully activate, nor will it sufficiently activate, the dopant to obtain the desired results. For example, only approximately 50% of the phosphorous dopant is activated using a furnace anneal at 850° Celsius for five minutes (plus ramp up and ramp down). The furnace annealing process will, however, cause the source 30 and drain 32 to go from a first depth indicated by lines 34 in FIG. 5 to a second depth as represented by lines 36.

In order to more fully activate the dopant without the dopant diffusing excessively in n-well 13, an RTP process may be used to further activate the dopant. The RTP process may occur, for example, for 15 seconds at 1000° Celsius. The further RTP processing, or RTP booster, will more fully activate the dopant while only increasing the source 30 and drain 32 depths slightly to a third depth as shown by line 38 in FIG. 5. Thus, the junction depth is not particularly sensitive to variations in the RTP process.

Figure 6:
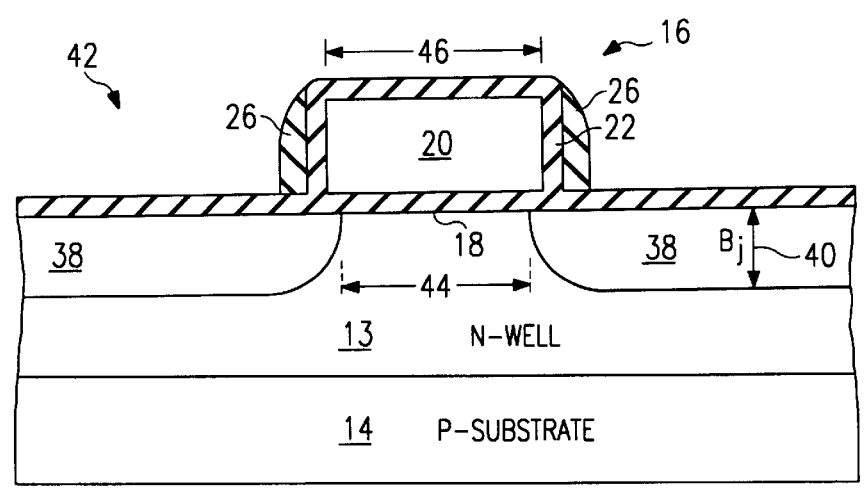
FIG. 6 is a cross-sectional view of a portion of a semiconductor chip reflecting some of the steps of the fabrication of a semiconductor device.

As shown in FIG. 6, after the RTP booster process, the junction depth 40 for source 30 and drain 32 will be completed. The semiconductor device 42 such as a PMOS transistor, will have an effective channel length as shown by reference numeral 44 and will have a polygate length as shown by reference numeral 46.

Figure 7:
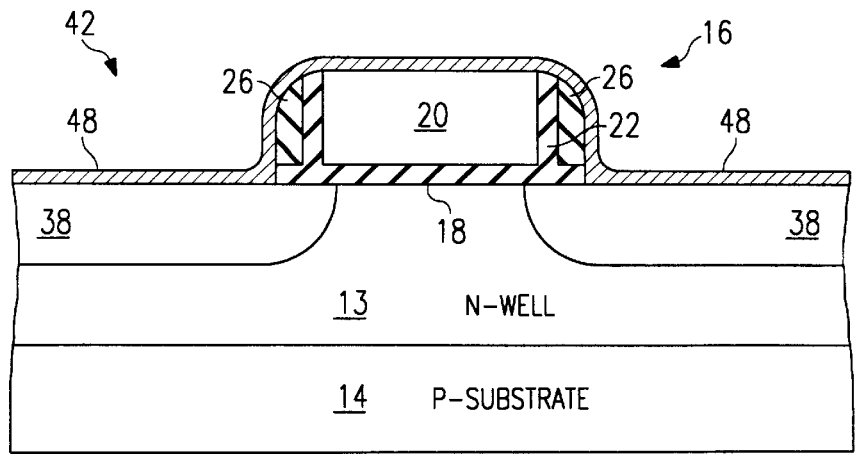
FIG. 7 is a cross-sectional view of a portion of a semiconductor chip reflecting some of the steps of the fabrication of a semiconductor device.
Figure 8:
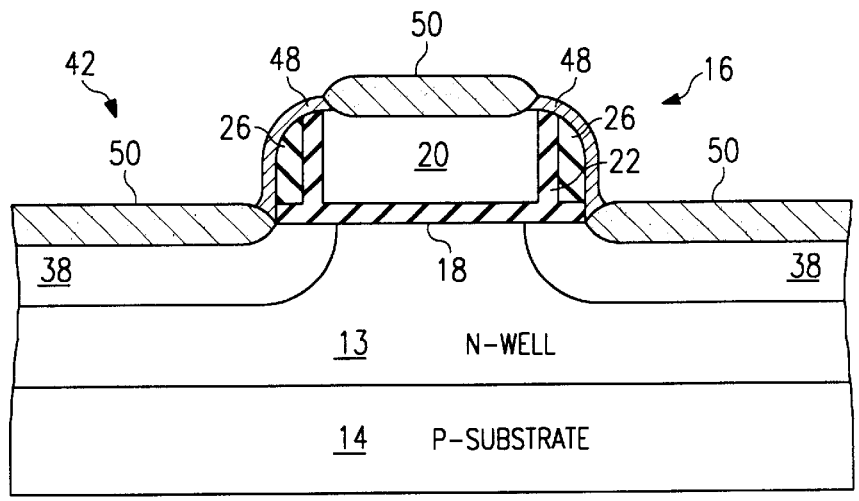
FIG. 8 is a cross-sectional view of a portion of a semiconductor chip reflecting some of the steps of the fabrication of a semiconductor device.
Figure 9:
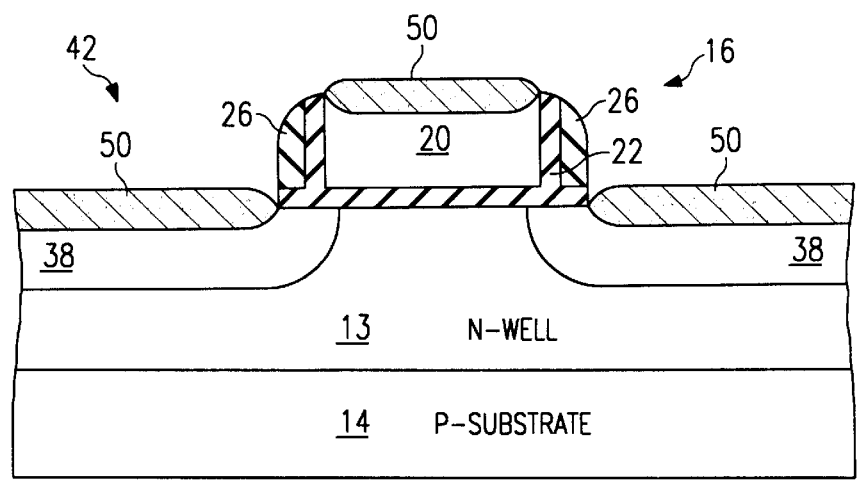
FIG. 9 is a cross-sectional view of a portion of a semiconductor chip reflecting some of the steps of the fabrication of a semiconductor device.
Figure 10:
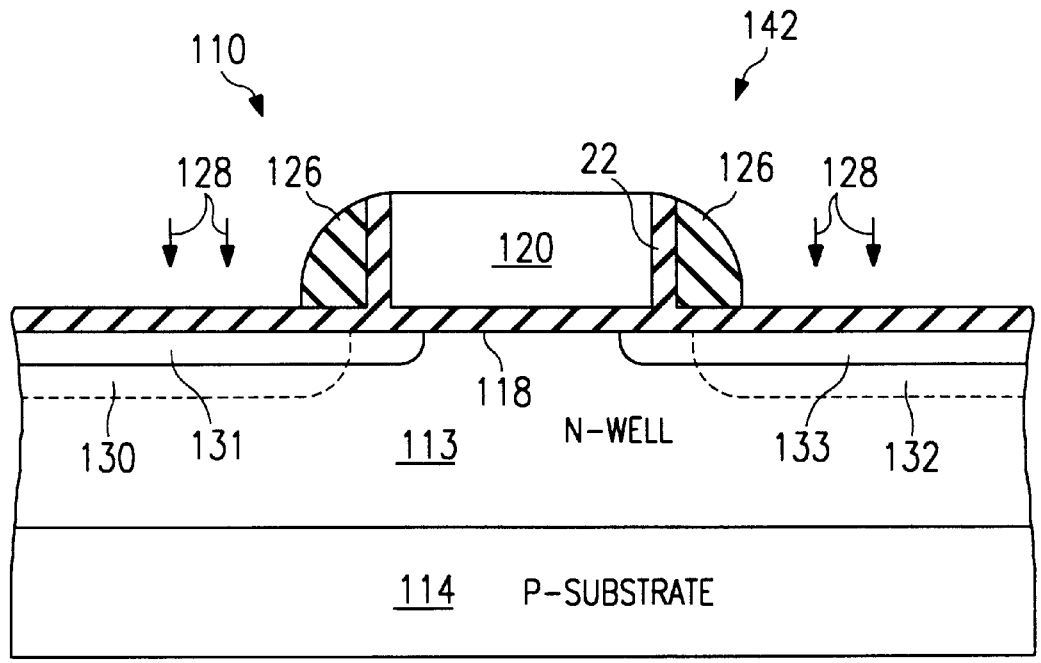
FIG. 10 is a cross-sectional view of a portion of a semiconductor chip showing aspects of another embodiment of the present invention.

Referring to FIGS. 7–8, the oxide over the n-well and poly gate are removed by a dry and/or a wet etch and then a titanium layer 48 may then be placed over device 42. The titanium layer 48 may be applied with a sufficient thickness, which in the PMOS embodiment described is 400 Å. The titanium layer 48 will react with the silicon to form titanium disilicide ($TiSi_2$) 50. The titanium reacts with the silicon in response to activation by a furnace and/or by RTP. This reaction process may consume part of the source and drain, and if it consumes too much of the source or drain's dopant, it may short out the device 42. As reflected in FIG. 9, remaining titanium 48 may be stripped off using a chemical bath. Once titanium 48 is removed, device 42 is complete and can be connected to metal interconnects to titanium disilicide 50.

The present invention may also be used with other techniques for forming semiconductor devices. For example, with reference to FIG. 10, aspects of the present invention will be described with reference to an alternative embodiment. Semiconductor device 142 is formed on a portion of a semiconductor chip 110 and on an n-well 113 which has a substrate 114. A shallow drain extender may be used in forming device 142. A shallow source 131 and a shallow drain 133 may be formed by using a low energy implant (for example, 15 keV for phosphorous for NMOS transistors and 15 keV for boron fluoride for PMOS transistors). Once shallow extenders, 131 and 133, are formed, sidewall 126 may be formed from a nitride addition selectively removed with an anisotropic sidewall etch. A deeper portion of the source and drain may be formed after sidewall 126 is formed, as shown by reference numerals 130 and 132, through implantation of a highly diffusible dopant as indicated by arrows 128. The furnace and RTP anneals are performed after the last source and drain implants. Both shallow drain extenders 131 and 133 and source and drain 130 and 132 benefit from the combination of furnace and RTP anneals.

Figure 11:
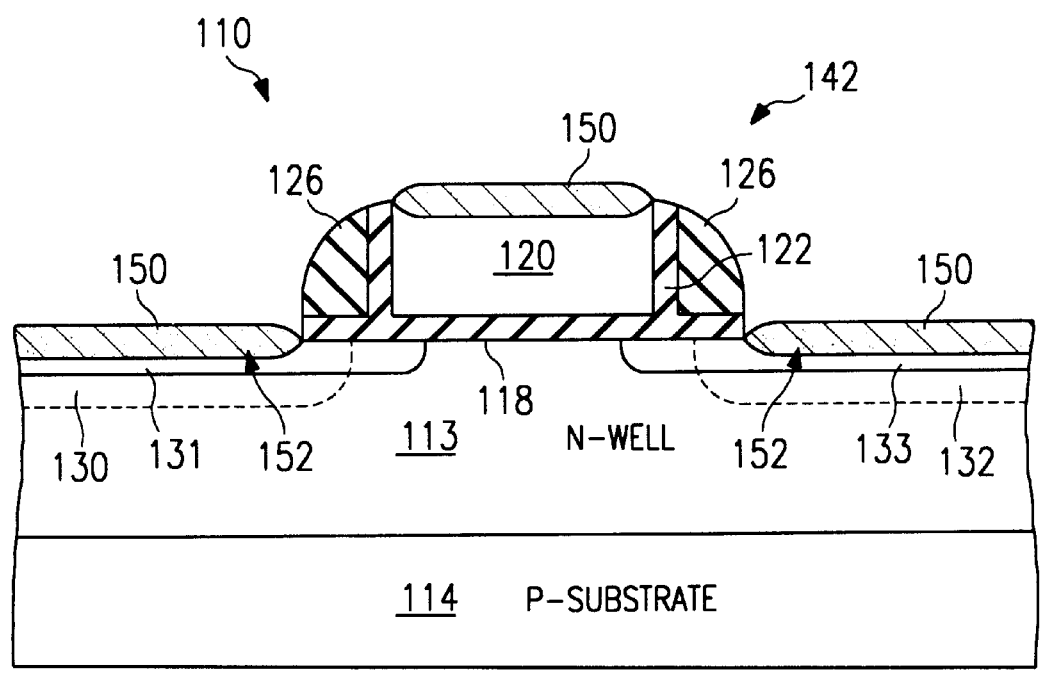
FIG. 11 is a cross-sectional view of a portion of a semiconductor chip showing aspects of another embodiment of the present invention.

Now referring to FIG. 11, the titanium disilicide process has been utilized to arrive at a completed device 142. In the completed device 142, aspects of the present invention are useful in forming device 142 because using an RTP booster provides additional concentration of electrically active dopant to form source 130 and drain 132. This helps minimize the dopant that may be consumed in forming titanium disilicide contacts 150. The consumption of the dopant by the titanium disilicide is represented by arrows 152. If too much dopant is lost to the titanium disilicide, the transistor series resistance will increase and performance will be degraded. In addition, the performance of the transistor will be degraded unless the electrically active concentration of dopant is high in the shallow drain extender to minimize spreading resistance adjacent to the MOSFET channel underneath the gate.

Although the present invention and its advantages have been described in detail, it should be understood that various changes, substitutions and alterations can be made herein without departing from the spirit and scope of the invention as defined by the following claims.

What is claimed is:

1. A method for forming a semiconductor device having a semiconductor body, comprising the steps of:

forming a gate over the semiconductor body;

implanting a dopant into the semiconductor body proximate the gate;

activating a portion of the dopant using a furnace at a temperature of approximately 875° C. for approximately 5 minutes; and further activating the dopant using rapid thermal anneal processing (RTP) at a temperature in a range of approximately 975 to 1025° Celsius for a time in the range of approximately 10 to 20 seconds.

2. The method of claim 1 wherein the step of further activating the dopant using rapid thermal processing (RTP) comprises the step of heating the dopant at approximately 1000° Celsius for a time period in the range of approximately 10 to 20 seconds.

3. The method of claim 1 wherein the step of further activating the dopant using rapid thermal processing (RTP) comprises the step of heating the dopant at approximately 975° Celsius for a time period in the range of 10 to 20 seconds.

4. The method of claim 1 wherein the step of further activating the dopant using rapid thermal processing (RTP) comprises the step of heating the dopant at approximately 1025° Celsius for a time period of approximately 10 to 20 seconds.

5. The method of claim 1 wherein the step of further activating the dopant using rapid thermal processing (RTP) comprises the step of heating the dopant at approximately 1000° Celsius for approximately 15 seconds.

6. The method of claim 1 wherein the step of implanting a dopant comprises the step of implanting boron into the semiconductor body proximate the gate.

7. A method for forming a semiconductor device comprising the steps of:
   forming a semiconductor substrate;
   forming a polysilicon gate, wherein the step of forming the polysilicon gate comprises:
      forming a first oxide layer and a polysilicon layer thereon over a portion of a surface of the substrate,
      forming a second oxide layer over the polysilicon gate and a portion of the substrate proximate to the polysilicon gate, and
      forming sidewalls proximate to the polysilicon gate;
   implanting a dopant into the substrate proximate the sidewalls;
   activating a portion of the dopant using a furnace at a temperature of approximately 875° C. for approximately 5 minutes; and
   further activating the dopant using rapid thermal processing (RTP) at a temperature in a range of 975 to 1025° C. for a time period of approximately 10 to 20 seconds.

8. The method of claim 7 wherein the step of further activating the dopant using rapid thermal processing (RTP) comprises the step of heating the dopant at approximately 1000° Celsius for a time period in the range of 10 to 20 seconds.

9. The method of claim 7 wherein the step of further activating the dopant using rapid thermal processing (RTP) comprises the step of heating the dopant at approximately 975° Celsius for a time period of approximately 10 to 20 seconds.

10. The method of claim 7 wherein the step of further activating the dopant using rapid thermal processing (RTP) comprises the step of heating the dopant at approximately 1025° Celsius for a time period of approximately 10 to 20 seconds.

11. The method of claim 7 wherein the step of further activating the dopant using rapid thermal processing (RTP) comprises the step of heating the dopant at approximately 1000° Celsius for approximately 15 seconds.

12. The method of claim 11 wherein the step of implanting a dopant comprises implanting boron.

13. A process for manufacturing a semiconductor device, the process comprising the steps of:
   forming a semiconductor substrate;
   forming a polysilicon gate, wherein the step of forming the polysilicon gate comprises:
      forming a first oxide layer and a polysilicon layer thereon over a portion of a surface of the substrate,
      forming a second oxide layer over the polysilicon gate and a portion of the substrate proximate to the polysilicon gate, and
      forming sidewalls proximate to the polysilicon gates;
   forming a shallow drain extender proximate the polysilicon gate;
   implanting a dopant into the substrate proximate the sidewalls;
   activating a portion of the dopant using a furnace at a temperature of approximately 875° C. for approximately 5 minutes; and
   further activating the dopant using rapid thermal processing (RTP) at a temperature in a range of 975 to 1025° C. for a time period of approximately 10 to 20 seconds.

14. The process of claim 13 wherein the process of forming a shallow drain extender proximate the gate comprises the step of forming a moderately doped drain extender.

* * * * *